(12) United States Patent
Yu

(10) Patent No.: US 7,973,600 B2
(45) Date of Patent: Jul. 5, 2011

(54) DOHERTY POWER AMPLIFIER

(75) Inventor: Dae-Kyu Yu, Pohang-si (KR)

(73) Assignee: WiPAM, Inc. (KR)

( * ) Notice: Subject to any disclaimer, the term of this patent is extended or adjusted under 35 U.S.C. 154(b) by 0 days.

(21) Appl. No.: 12/302,207

(22) PCT Filed: May 18, 2007

(86) PCT No.: PCT/KR2007/002424
§ 371 (c)(1),
(2), (4) Date: Nov. 24, 2008

(87) PCT Pub. No.: WO2007/142414
PCT Pub. Date: Dec. 13, 2007

(65) Prior Publication Data
US 2009/0273398 A1    Nov. 5, 2009

(30) Foreign Application Priority Data

Jun. 7, 2006 (KR) .................. 10-2006-0050788

(51) Int. Cl.
*H03F 1/07* (2006.01)
(52) U.S. Cl. .................. 330/124 R; 330/295
(58) Field of Classification Search .............. 330/124 R, 330/295, 84, 126, 302
See application file for complete search history.

(56) References Cited

U.S. PATENT DOCUMENTS

| | | | | |
|---|---|---|---|---|
| 6,424,223 B1 * | 7/2002 | Wang et al. | .................. | 330/286 |
| 7,193,472 B2 * | 3/2007 | Gotou et al. | .................. | 330/295 |
| 7,295,074 B2 * | 11/2007 | Wong et al. | ................ | 330/124 R |
| 7,336,127 B2 * | 2/2008 | Kennan | ...................... | 330/124 R |
| 7,342,444 B2 * | 3/2008 | Kim et al. | ................ | 330/124 R |

* cited by examiner

*Primary Examiner* — Hieu P Nguyen
(74) *Attorney, Agent, or Firm* — Thomas, Kayden, Horstemeyer & Risley, LLP.

(57) ABSTRACT

The present invention relates to a power amplifier; and, more particularly, to a Doherty power amplifier. The power amplifier includes at least one carrier amplifier; at least one peaking amplifier arranged in parallel with the carrier amplifier in such a manner that the carrier amplifier and the peaking amplifier collectively operate as a Doherty amplifier; a plurality of input matching circuits, at least one of which is respectively connected to an input ends of the carrier amplifier and the peaking amplifier; at least one impedance control circuit, each of which is connected to an output end of each carrier amplifier for controlling a load line impedance of the said each carrier amplifier; at least one output matching circuit directly or indirectly connected to output ends of the impedance control circuit and the peaking amplifier; and at least one first delay circuit for matching delays between the carrier amplifier and the peaking amplifier. The present invention provides an improved Doherty power amplifier capable of achieving a further miniaturization and integration while maintaining an advantage in terms of efficiency and linearity of a Doherty power amplifier by employing an improved output and input matching method, and capable of operating more similar to the ideal operation of a Doherty power amplifier by applying an improved input power division method thereto.

16 Claims, 4 Drawing Sheets

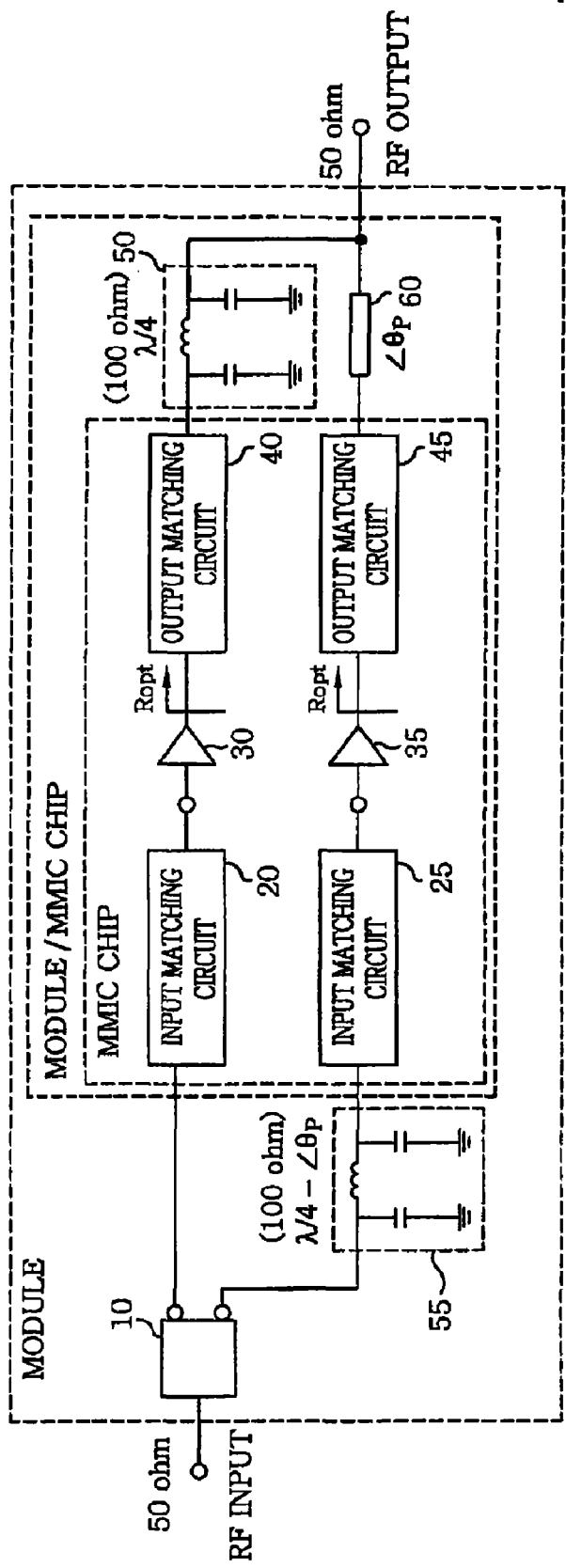
[Fig. 1]
(PRIOR ART)

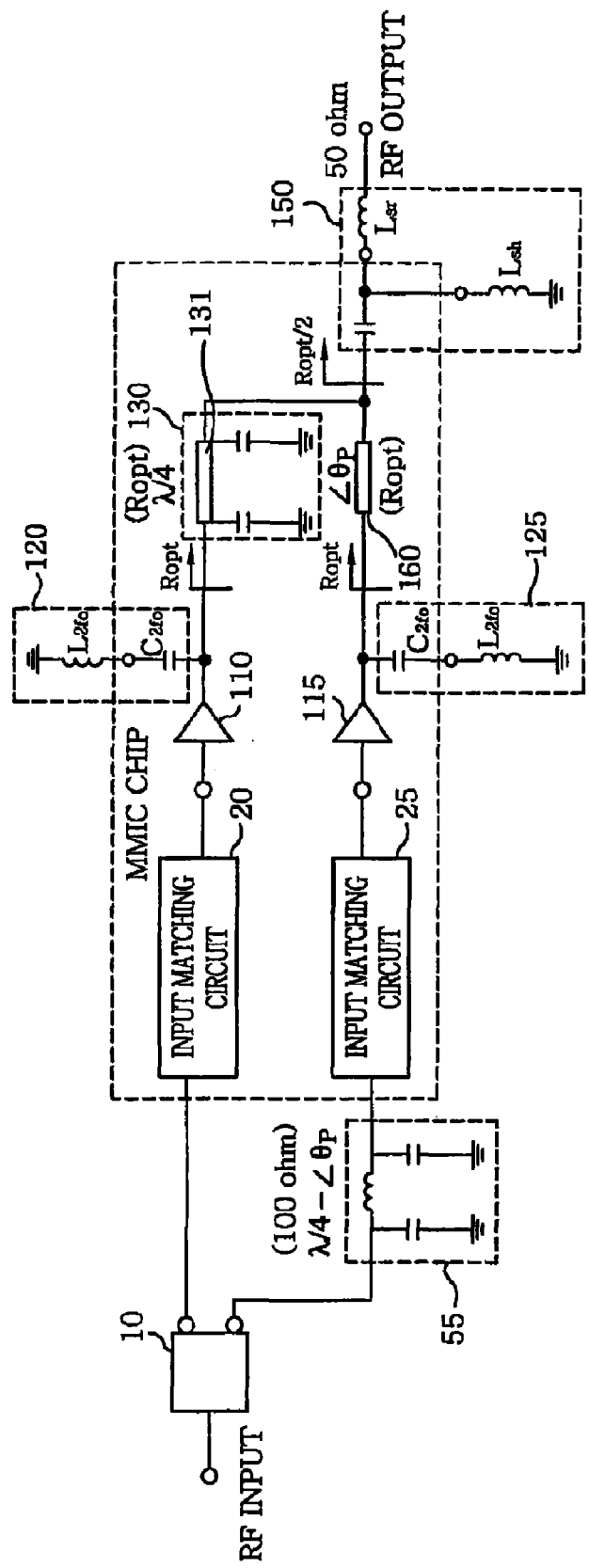
[Fig. 2]

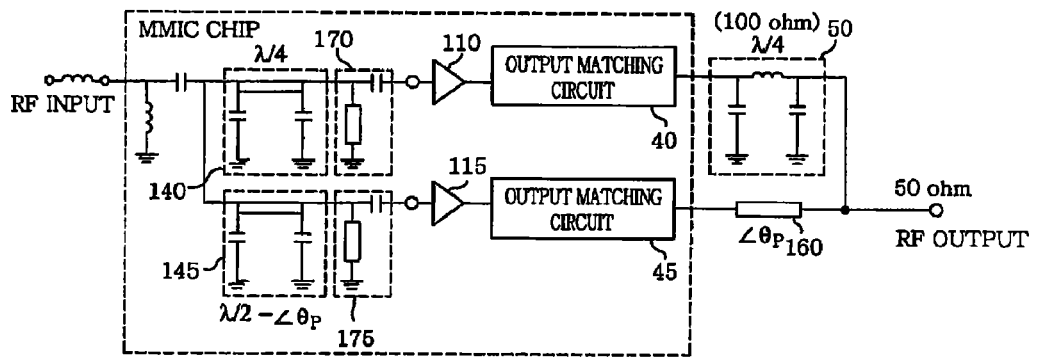
[Fig. 3]
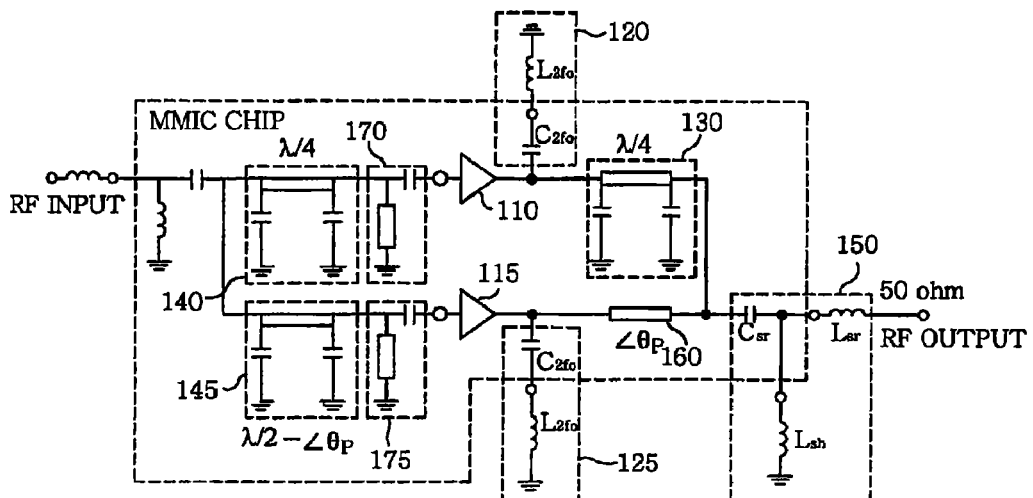
[Fig. 4]
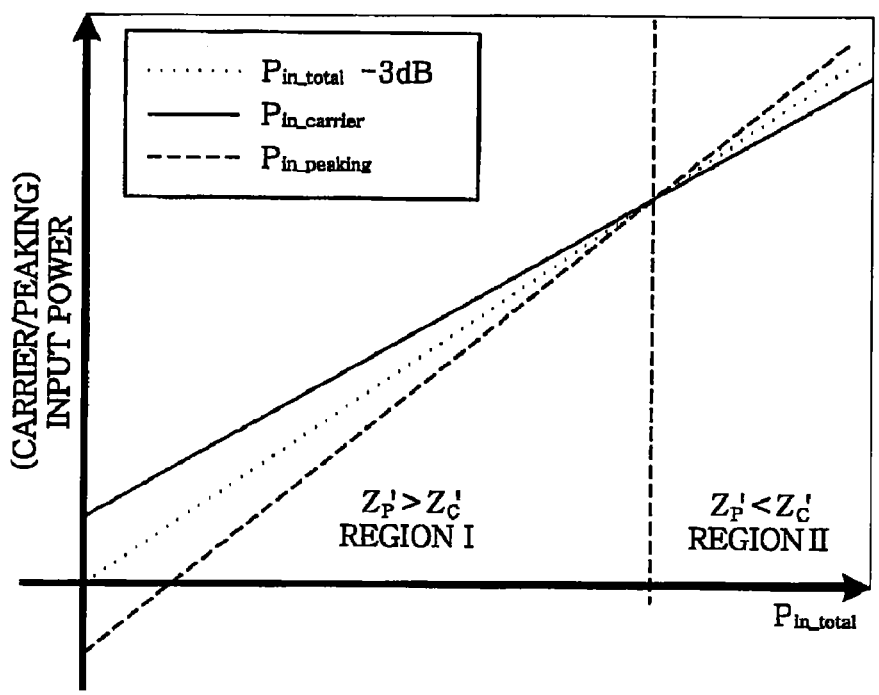
[Fig. 5]

[Fig. 6]
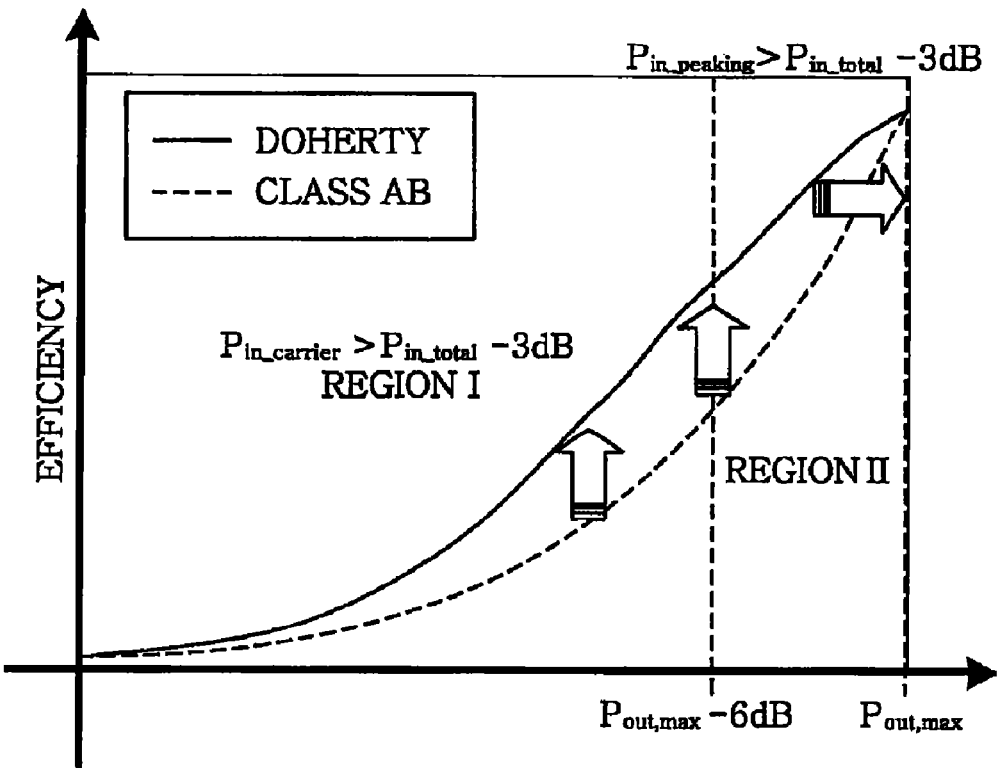
[Fig. 7]
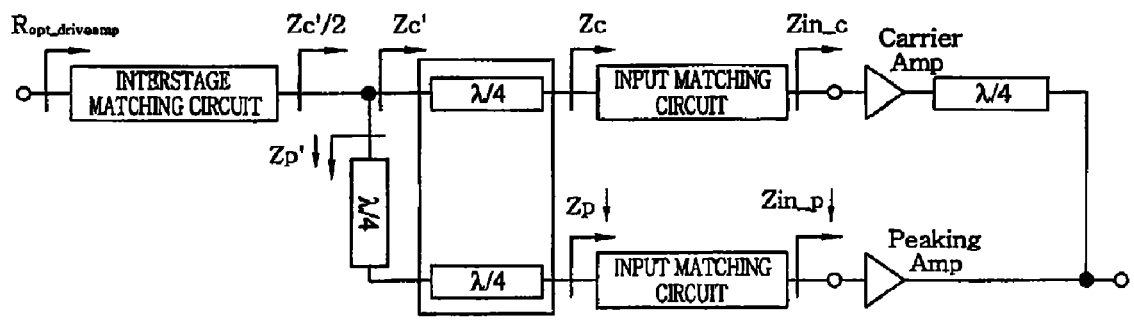

DOHERTY POWER AMPLIFIER

CROSS-REFERENCE TO RELATED APPLICATION

This application is a co-pending application which claims priority to PCT Application No. PCT/KR2007/002424, filed May 18, 2007, herein incorporated by reference in its entirety.

TECHNICAL FIELD

The present invention relates to a power amplifier, and more particularly, to a Doherty power amplifier capable of being integrated on a chip by miniaturization thereof.

BACKGROUND ART

As efforts to extend usable time of batteries in mobile handsets, repeaters and base stations used for mobile communications while they are getting more miniaturized and multifunctional, lots of researches have been done recently to improve the efficiencies of RF power amplifiers that occupies most of the power consumption. Especially, researches on a Doherty power amplifier as one of typical schemes for enhancing the efficiency of a power amplifier are actively progressing.

As well-known in the art, a Doherty power amplifier, which was first designed in 1936 by W. H. Doherty, has a structure that connects a carrier amplifier and a peaking amplifier in parallel by using a quarter-wave transformer, i.e., a $\lambda/4$ line. The Doherty amplifier is driven by a symmetrical power coupling method that controls a load line impedance of the carrier amplifier by changing an amount of a current supplied from the peaking amplifier to the load according to a power level to thereby improve the amplification efficiency.

When designing a Doherty amplifier for use in mobile communications, a limitation in size thereof is getting more important, and there is a trend of the Doherty amplifier getting more miniaturized. However, conventional methods for implementing such Doherty amplifiers have drawbacks of high production costs due to the sizes of the chips and the packages thereof. Most noticeably, quarter-wave transformers for controlling load line impedances of carrier amplifiers and 3 dB 90° hybrid splitters for dividing input powers are major causes of the increase in the production cost of a Doherty amplifier for use in mobile communications.

FIG. 1 shows a conventional Doherty power amplifier, wherein a $\lambda/4$ $\pi$-network 50 configured with an inductor (L) and two capacitors (C) is employed as a quarter-wave transformer.

As shown therein, input matching circuits 20 and 25 are connected to input ends of a carrier amplifier 30 and a peaking amplifier 35, respectively, and output matching circuits 40 and 45 are connected to output ends thereof, respectively.

In this configuration, a 3 dB 90° hybrid splitter for dividing an input power is omitted to downsize the Doherty power amplifier. Herein, the input end of the carrier amplifier 30 keeps connected with that of the peaking amplifier 35, and the first delay circuit 55 is added between the power splitter 10 and the input end of the peaking amplifier 35 in order to match delays between the peaking amplifier 35 and the carrier amplifier 30, and a $\lambda/4$ $\pi$-network functioning as a quarter-wave transformer is used as the first delay circuit 55.

Further, an offset line 60 is connected to an output end of the output matching circuit 45 to set an output impedance to the peaking amplifier 35 to be infinite, thereby preventing power leaking from the carrier amplifier 30 to the peaking amplifier 35 instead of being delivered to the load at a low power level. If a phase of the offset line 60 is $\angle\theta_P$, the first delay circuit 55 is set to be a $\lambda/4 - \angle\theta_P$ $\pi$-network at the input end of the peaking amplifier 35.

However, a conventional Doherty amplifier as described above is difficult to be integrated on a single chip because of its size and the inductor loss. Therefore, in most cases, a Doherty amplifier is implemented by a PCB (Printed Circuit Board) package. However, this scheme still has drawbacks in that the package size thereof and the number of passive devices used therefor are relatively large, thereby increasing the production cost thereof.

Further, other approaches have also been proposed in order to prevent the problems when using a 3 dB 90° hybrid splitter for dividing an input power. For example, some approaches are to modify the structure of the Doherty amplifier into a bypass type structure by using a switch, and others are to employ an active phase distributor. However, such endeavors also fail to present satisfactory solutions to overcome the above problems. In the meantime, for an ideal operation of a Doherty amplifier for use in a base station, it is required for the input power not to be divided identically to the carrier and the peaking amplifiers with a power level of 3 dB at a higher power level, but to be divided such that a slightly higher power is applied to the peaking amplifier than to the carrier amplifier at the higher power level. However, the above-mentioned conventional techniques cannot meet such requirements.

DISCLOSURE OF INVENTION

Technical Problem

It is, therefore, an object of the present invention to provide an improved Doherty power amplifier capable of achieving a further miniaturization and integration while maintaining an advantage in terms of efficiency and linearity of a Doherty power amplifier by employing an improved output and input matching method.

It is another object of the present invention to provide an improved Doherty power amplifier capable of operating more similar to the ideal operation of a Doherty power amplifier by applying an improved input power division method thereto.

Technical Solution

In accordance with an aspect of the present invention, there is provided a power amplifier, including at least one carrier amplifier; at least one peaking amplifier arranged in parallel with the carrier amplifier in such a manner that the carrier amplifier and the peaking amplifier collectively operate as a Doherty amplifier; a plurality of input matching circuits, at least one of which is respectively connected to an input ends of the carrier amplifier and the peaking amplifier; at least one impedance control circuit, each of which is connected to an output end of each carrier amplifier for controlling a load line impedance of the said each carrier amplifier; at least one output matching circuit directly or indirectly connected to output ends of the impedance control circuit and the peaking amplifier; and at least one first delay circuit, each of which is connected to an input end of one of the input matching circuits connected to the input end of the peaking amplifier for matching delays between the carrier amplifier and the peaking amplifier.

In accordance with another aspect of the present invention, there is provided a power amplifier, including at least one carrier amplifier; at least one peaking amplifier arranged in parallel with the carrier amplifier in such a manner that the carrier amplifier and the peaking amplifier collectively operate as a Doherty amplifier; a plurality of output matching circuits, at least one of which is respectively connected to an output ends of the carrier amplifier and the peaking amplifier; at least one impedance control circuit, each of which is connected to an output end of each of the output matching circuits connected to the output end of the carrier amplifier for controlling a load line impedance of the said each carrier amplifier; a plurality of input matching circuits, at least one of which is respectively connected to an input ends of the carrier amplifier and the peaking amplifier; at least one power dividing circuit connected to an input end of each of the input matching circuits connected to the input end of the peaking amplifier for supplying a higher power to the peaking amplifier than to the carrier amplifier when an input power level becomes high; and at least one second delay circuit connected to an input end of each of the input matching circuits connected to the input end of the carrier amplifier for matching delays between the carrier amplifier and the peaking amplifier.

In accordance with still another aspect of the present invention, there is provided a power amplifier, including at least one carrier amplifier; at least one peaking amplifier arranged in parallel with the carrier amplifier in such a manner that the carrier amplifier and the peaking amplifier collectively operate as a Doherty amplifier; a plurality of input matching circuits, at least one of which is respectively connected to an input ends of the carrier amplifier and the peaking amplifier; at least one impedance control circuit, each of which is connected to an output end of each carrier amplifier for controlling a load line impedance of the said each carrier amplifier; at least one output matching circuit directly or indirectly connected to output ends of the impedance control circuit and the peaking amplifier; at least one power dividing circuit connected to an input end of each of the input matching circuits connected to the input end of the peaking amplifier for supplying a higher power to the peaking amplifier than to the carrier amplifier when an input power level becomes high; and at least one second delay circuit connected to an input end of each of the input matching circuits connected to the input end of the carrier amplifier for matching delays between the carrier amplifier and the peaking amplifier.

Advantageous Effects

As described above, the present invention has advantageous effects in that it can provide an improved Doherty power amplifier capable of achieving a further miniaturization and integration while maintaining an advantage in terms of efficiency and linearity of a Doherty power amplifier by employing an improved output and input matching method, and capable of operating more similar to the ideal operation of a Doherty power amplifier by applying an improved input power division method thereto.

BRIEF DESCRIPTION OF THE DRAWINGS

FIG. 1 shows a circuit diagram of a conventional Doherty power amplifier, wherein a π-network is employed as a quarter-wave transformer;

FIG. 2 illustrates a circuit diagram of a Doherty amplifier employing an output matching method in accordance with a first embodiment of the present invention;

FIG. 3 illustrates a circuit diagram of a Doherty amplifier employing an input matching method in accordance with a second embodiment of the present invention;

FIG. 4 illustrates a circuit diagram of a Doherty amplifier employing an improved input and output matching method in accordance with a third embodiment of the present invention;

FIG. 5 represents a graph showing a power division of the Doherty amplifier in accordance with the present invention;

FIG. 6 depicts a graph showing efficiency as a function of an output power of the Doherty amplifier in accordance with the present invention in comparison with that of a class-AB amplifier; and FIG. 7 sets forth a simplified circuit diagram for explaining an operation of an input matching circuit for implementing an improved power division method in the Doherty amplifier in accordance with the present invention.

MODE FOR THE INVENTION

Hereinafter, preferred embodiments of the present invention will be set forth in detail with reference to the accompanying drawings. In describing the present invention, explanations of existing elements or well-known functions will be omitted when they might defocus the point of the present invention.

FIG. 2 illustrates a circuit diagram of a Doherty amplifier employing an output matching method in accordance with a first embodiment of the present invention. Herein, identical reference numerals designate the same elements in comparison with FIG. 1.

If a quarter-wave transformer for controlling a load line impedance of a carrier amplifier in a Doherty amplifier is configured with a λ/4 π-network composed of at least one inductor(s)(L) and at least one capacitor(s)(C) as shown in FIG. 1, it has drawbacks in terms of the chip size and power loss at the passive devices. In this case, one important factor is the inductance. In a conventional Doherty amplifier shown in FIG. 1, a characteristic impedance of the quarter-wave transformer arranged at an output end of the carrier amplifier is equal to 100 Ohm. Further, the inductance corresponding thereto is obtained by the equation of $L=Z_0/\omega_0$. As seen therefrom, the quarter wave transformer can be implemented by using an inductor of a smaller inductance as the characteristic impedance becomes lower.

Therefore, in accordance with the present embodiment, the characteristic impedance of the quarter-wave transformer is set to a desired value $R_{opt}$. To this end, a load resistance, which was equal to 50 Ohm in the conventional case shown in FIG. 1, is matched to $R_{opt}/2$. By doing so, the characteristic impedance of the quarter-wave opt transformer of the carrier amplifier is lowered from the previous 100 Ohm to $R_{opt}$. Although $R_{opt}$ varies depending on a level of an output power, it is usually less than 10 Ohm and becomes smaller as the output power level is heightened. Therefore, in accordance with the output matching method of the present embodiment, the inductance required for the quarter-wave transformer of the carrier amplifier can be reduced at least about ten times in comparison with the conventional matching method. Further, in accordance with the present embodiment, unlike the conventional matching method in which two output matching units are respectively arranged for the carrier and the peaking amplifier, only a single output matching circuit is required therefor. In addition, in accordance with the present embodiment, an inductor, which is a passive element constituting a matching circuit, can be configured with a bonding inductor (like a bondwire inductor). Thus, it is possible to reduce the number of passive devices used for the output matching circuit(s) of the carrier and the peaking amplifier to a half or less, which implies that the chip size of the Doherty amplifier and the loss caused by passive devices can be decreased.

As presented in FIG. 2, the Doherty amplifier using the output matching method in accordance with the present invention can considerably reduce the number of passive devices used for an impedance matching in the Doherty amplifier as set forth above, thereby allowing all passive devices to be integrated in an MMIC (Monolithic Microwave Integrated Circuit) chip.

Referring to FIG. 2, the Doherty amplifier using the output matching method of the present invention includes input matching circuits 20 and 25; a first delay circuit 55; a carrier amplifier 110; a peaking amplifier 115; secondary harmonic short circuits 120 and 125; an impedance control circuit 130; an output matching circuit 150; and an offset line 160. More specifically, the carrier and the peaking amplifier 110 and 115 are arranged in parallel, and the input matching circuits 20 and 25 are connected to the input ends of the carrier and the peaking amplifier 110 and 115, respectively. The impedance control circuit 130 including a λ/4 π-network serving as a quarter-wave transformer is connected to the output end of the carrier amplifier 110 for adjusting the load line impedance thereof. The impedance control circuit 130 is followed by the output matching circuit 150, and the output end of the peaking amplifier 115 is connected to the output matching circuit 150 via the offset line 160. The first delay circuit 55 is connected to the input end of the input matching circuit 25 arranged at the input end of the peaking amplifier 115 to match delays between the carrier amplifier 110 and the peaking amplifier 115, wherein a λ/4 π-network is provided for the above purpose. The offset line 160 serves to transform the output impedance of the peaking amplifier 115 to nearly open, thereby preventing the power leakage of the output power of the carrier amplifier 110 into the peaking amplifier 115 in low power ranges. In this case, if the offset line 160 is $\angle \theta_P$, the first delay circuit 55 connected to an input end of the peaking amplifier 115 is configured with a $\lambda/4 - \angle \theta_P$ π-network like a prior art shown in FIG. 1. Further, the secondary harmonic short circuits 120 and 125 serve to enhance the linearity of the amplifier.

As shown in FIG. 2, the impedance control circuit 130 is configured by using a micro-strip line 131 instead of an inductor (L). This is allowed because the inductance can be reduced about ten times or more compared to the case employing the conventional matching method.

As described above, in accordance with the first embodiment of the present invention, the output matching circuit 150 is matched to $R_{opt}/2$, and the characteristic impedance of the impedance control circuit 130 has a value of $R_{opt}$, wherein $R_{opt}$ designates an optimal source impedance of the impedance control circuit 130.

Although FIG. 2 describes an example where the Doherty amplifier is configured with only a pair of the carrier and the peaking amplifier 110 and 115 are arranged in parallel, it may also be possible to implement a Doherty amplifier (such as one for a use of a base station) by arranging two or more pairs of carrier and peaking amplifiers in parallel by applying a same principle as that of the present invention. For example, an N-number of identical carrier amplifiers and an N-number of identical peaking amplifiers may be arranged in parallel, and an N-number of impedance control circuits are connected to output ends of the N-number of carrier amplifiers, respectively, where N is a positive integer. In this configuration, a characteristic impedance of each of the N-number of impedance control circuits has a value of $R_{opt}$ if the output matching circuit is matched to $R_{opt}/2N$, wherein $R_{opt}$ designates an optimal source impedance of each of the impedance control circuits.

Hereinafter, an input matching method in accordance with the present invention will be described. In accordance with the input matching method of the present invention, it is possible to lower a characteristic impedance of the quarter-wave transformer of a first delay circuit arranged at an input end of the peaking amplifier for matching delays between the carrier and the peaking amplifier. Conventionally, an input impedance of the Doherty amplifier is matched to 50 Ohm based on a gain of an auxiliary amplifier (i.e., a drive amplifier) at an RF input end required for increasing the gain of the amplifier, and then, the matching between the auxiliary amplifier and a main amplifier (that are configured with a carrier and a peaking amplifier) are established by way of matching input impedances of the carrier and the peaking amplifier to 100 Ohm. However, the above-mentioned conventional method has a drawback that the characteristic impedance of the quarter-wave transformer (λ/4 line) arranged at the input end of the peaking amplifier becomes 100 Ohm as described above. In this regard, in accordance with the input matching method of the present invention, $R_{opt}$ of the auxiliary amplifier is matched to a value that is a half of desired characteristic impedance $R_{in}$ under the principle as mentioned above. Thus, the matching between the auxiliary and the main amplifier is established by matching the input impedances of the carrier and the peaking amplifier to $R_{in}$. By doing this, the characteristic impedance of the quarter-wave transformer arranged at the input end of the peaking amplifier can be reduced from 100 Ohm to the desired value of $R_{in}$, thereby reducing an inductance of an inductor in the quarter-wave transformer. As a result, a further miniaturization and integration can be achieved with respect to an input matching circuit of the Doherty amplifier.

FIG. 3 provides a circuit diagram of a Doherty amplifier employing the input matching method in accordance with a second embodiment of the present invention. Herein, identical reference numerals designate the same elements in comparison with FIG. 2.

Referring to FIG. 3, the Doherty amplifier of the present embodiment includes a plurality of output matching circuits 40 and 45; a λ/4 π-network 50; a carrier and a peaking amplifier 110 and 115; a second delay circuit 140; a power dividing circuit 145; an offset line 160; and a plurality of input matching circuits 170 and 175. More specifically, the carrier and the peaking amplifier 110 and 115 are arranged in parallel, and the output matching circuits 40 and 45 are connected to output ends of the carrier and the peaking amplifier 110 and 115, respectively. The λ/4 π-network 50 is connected, as an impedance control circuit, to an output end of the output matching circuit 40 arranged at an output end of the carrier amplifier 110 for adjusting a load line impedance thereof. The input matching circuits 170 and 175 are connected to input ends of the carrier and the peaking amplifier 110 and 115, respectively. The power dividing circuit 145 is connected to an input end of the input matching circuit 175 that is in turn connected to an input end of the peaking amplifier 115. A λ/2 π-network in the power dividing circuit 145 serves to supply higher power to the peaking amplifier 115 than to the carrier amplifier 110 when an input power level is high. The second delay circuit 140 including a λ/4 π-network is connected to an input end of the input matching circuit 170 disposed at an input end of the carrier amplifier 110 in order to match delays between the carrier amplifier 110 and the peaking amplifier 115. Also, arranged at an output end of the output matching circuit 45 is an offset line 160 which serves to make the output impedance of the peaking amplifier 115 transformed to nearly open, thereby preventing the power leakage of the output power of the carrier amplifier 110 into peaking amplifier in low power ranges. In this case, if the offset line 160 is $\angle \theta_P$, the power dividing circuit 145 connected to an input end of the peaking amplifier 115 is configured with a $\lambda/2 - \angle \theta_P$ π-network.

As described above, in accordance with the second embodiment of the present invention, an input impedance of the auxiliary amplifier arranged at the RF input end is matched to $R_{in}/2$, and input impedances of the carrier and the peaking amplifier 110 and 115 are matched to $R_{in}$, wherein $R_{in}$ designates an optimal input impedance of a main amplifier of the Doherty configured with the carrier and the peaking amplifier 110 and 115. In this manner, it is possible to establish an impedance matching between the main and the auxiliary amplifier.

Although FIG. 3 describes an example where the Doherty amplifier is configured with only a pair of the carrier and the peaking amplifier 110 and 115 are arranged in parallel, it may also be possible to implement a Doherty amplifier (such as one for a use of a base station) by arranging two or more pairs of carrier and peaking amplifiers in parallel by applying a same principle as that of the present invention. For example, an N-number of identical carrier amplifiers and an N-number of identical peaking amplifiers may be arranged in parallel, and an 2N-number of input matching circuits are connected to input ends of the carrier and peaking amplifiers, respectively, where N is a positive integer. In this configuration, the input impedance of the auxiliary amplifier arranged at the RF input end is matched to $R_{in}/2N$, and the input impedances of the carrier and the peaking amplifier are matched to $R_{in}$, wherein $R_{in}$ designates an optimal input impedance of a main amplifier of the Doherty configured with the carrier and the peaking amplifier. Thus, the impedance matching between the main and the auxiliary amplifier can be established.

FIG. 4 illustrates a circuit diagram of a Doherty amplifier in accordance with a third embodiment of the present invention, to which both the input and the output matching method of the present invention are applied. Herein, identical reference numerals designate the same elements in comparison with FIGS. 2 and 3.

Referring to FIG. 4, the Doherty amplifier in accordance with the third embodiment of the present invention includes a carrier amplifier 110; a peaking amplifier 115; an impedance control circuit 130; a second delay circuit 140; a power dividing circuit 145; an output matching circuit 150; and a plurality of input matching circuits 170 and 175. The carrier amplifier 110 and the peaking amplifier 115 are arranged in parallel, and the input matching circuits 170 and 175 are connected to input ends of the carrier and the peaking amplifier 110 and 115, respectively. The impedance control circuit 130 is connected to an output end of the carrier amplifier 110 for adjusting the load line impedance thereof. The impedance control circuit 130 is followed by the output matching circuit 150, and an output end of the peaking amplifier 115 is connected to the output matching circuit 150 via the offset line 60. The power dividing circuit 145, connected to an input end of the input matching circuit 175, serves to supply higher power to the peaking amplifier 115 than to the carrier amplifier 110 when an input power level becomes high. The second delay circuit 140 is connected to an input end of the input matching circuit 170 to match delays between the carrier amplifier 110 and the peaking amplifier 115. The third embodiment of the present invention as configured above employs both the output matching method of the first embodiment and the input matching method of the second embodiment. Since the output matching method and the input matching method are described in detail in the first and the second embodiments, details thereof will be omitted for simplicity.

In a conventional Doherty power amplifier, the carrier amplifier is biased as a class AB, and the peaking amplifier is biased as a class B or lower. This is for the purpose of elevating the efficiency of the power amplifier by turning on only the carrier amplifier in a low power area. However, in this scheme of power division, the peaking amplifier, unlike the carrier amplifier, cannot reach a maximum current level at a maximum power level. As a result, in the conventional Doherty amplifier, since the carrier amplifier reaches a saturation state at the maximum power level, the overall amplifier reaches a saturation state. Under such condition, the peaking amplifier is not able to produce a maximum power, and therefore, the overall devices cannot produce a maximum power thereof. This drawback can be overcome by using a power dividing scheme in accordance with the present invention, which is to be described referring to FIGS. 5 to 7. FIG. 5 is a graph showing a power division of the Doherty amplifier in accordance with the present invention. For high gain and efficiency and linearity improvement, the power division is designed such that, at a low power level, a higher power is supplied to the carrier amplifier that is in charge of the main role of the overall power amplifier, and at a high power level, a higher power is provided to the peaking amplifier that is turned on relatively later, thereby allowing both the carrier and the peaking amplifier to produce an approximately same power. FIG. 6 depicts a graph showing efficiency as a function of an output power of the Doherty amplifier in accordance with the present invention in comparison with that of a class-AB amplifier. Further, FIG. 7 sets forth a simplified circuit diagram for explaining an operation of an input matching circuit for implementing the power dividing method in the Doherty amplifier in accordance with the present invention. As described above, for the purpose of miniaturization and integration of input matching of a Doherty amplifier in accordance with the present invention, quarter-wave transformers are respectively added at the input ends of the peaking amplifier and the carrier amplifier. In accordance with the power dividing method of the present invention, two $\lambda/4$ transformers functioning as a $\lambda/2$ transformer are arranged at the input end of a peaking amplifier. In other words, in accordance with the present invention, another quarterwave transformer is added to the conventional Doherty amplifier having a single quarter-wave transformer arranged at the input end of the peaking amplifier as depicted in FIG. 1.

In a Doherty amplifier, an input impedance Zin_c of the carrier amplifier does not vary widely according to an input power level. On the other hand, an input impedance Zin_p of the peaking amplifier becomes smaller as the input power level becomes higher due to self bias effect. The self bias effect takes place in a peaking amplifier biased as a class C when a current level is increased as a power level is increased over a certain level enough to turn on the peaking amplifier. The input power division method in accordance with the present invention was conceived based on the above phenomenon. In a conventional Doherty amplifier, since a quarter-wave transformer is arranged at the input end of the peaking amplifier, the input impedance of the peaking amplifier at a node where the power division is made becomes higher as the power level increases. Therefore, as the power level increases, the input power to the peaking amplifier becomes lower than the input power to the carrier amplifier. This is opposite to the power division of the ideal Doherty amplifier as set forth above. Thus, by adding another quarter-wave transformer to the input end of the peaking amplifier, the behavior of the input impedance of the peaking amplifier is changed in an opposite way. Besides, in order to match delays between the carrier and the peaking amplifier, an additional quarter-wave transformer is further added to an input end of the carrier amplifier.

A photograph of a whole MMIC chip of a Doherty amplifier that is manufactured to be fully integrated as a single chip for a 5 GHz WLAN application in accordance with the present invention is presented as FIG. 4 in the page 179 of the paper named "Fully Integrated Doherty Power Amplifiers for 5 GHz Wireless-LANs" in IEEE Radio Frequency Integrated Circuits (RFIC) Symp., San Francisco, Calif. (USA), pp. 177-180, May 2006.

While the present invention has been described with respect to the particular embodiments, it will be apparent to those skilled in the art that various changes and modifications may be made without departing from the spirit and scope of the invention as defined in the following claims.

The invention claimed is:

1. A power amplifier, comprising:
at least one carrier amplifier;
at least one peaking amplifier arranged in parallel with the carrier amplifier in such a manner that the carrier amplifier and the peaking amplifier collectively operate as a Doherty amplifier;
a plurality of input matching circuits, at least one of which is respectively connected to the input ends of the carrier amplifier and the peaking amplifier;
at least one impedance control circuit, each of which is connected to an output end of each carrier amplifier for controlling a load line impedance of said each carrier amplifier;
at least one output matching circuit, in which an input end of the at least one output matching circuit is directly or indirectly connected to output ends of the impedance control circuit and the peaking amplifier;
at least one offset line, each of which is connected between each peaking amplifier and the output matching circuit for transforming an output impedance of said each peaking amplifier to nearly open; and
at least one first delay circuit, each of which is connected to an input end of one of the input matching circuits connected to the input end of the peaking amplifier for matching delays between the carrier amplifier and the peaking amplifier;
wherein the output matching circuit utilizes, as a passive device, a bonding inductor used for connecting a module to a monolithic microwave integrated circuit (MMIC) chip in which the power amplifiers are embedded.

2. The power amplifier of claim 1, wherein each of the impedance control circuit and the first delay circuit is a λ/4 transformer.

3. The power amplifier of claim 2, wherein the λ/4 transformer of the impedance control circuit is a π-network including at least one inductor and at least one capacitor, the inductor being a microstrip line.

4. The power amplifier of claim 1, wherein the at least one offset line is an offset line of $\angle\theta_p$, the impedance control circuit is a λ/4 transformer, and the first delay circuit is a λ/4−$\angle\theta_p$ transformer.

5. The power amplifier of claim 1, wherein the output matching circuit is matched to $R_{opt}/2$, and a characteristic impedance of the impedance control circuit is equal to $R_{opt}$, the said $R_{opt}$ being an optimal source impedance of the impedance control circuit.

6. The power amplifier of claim 1, wherein an N-number of identical peaking amplifiers are arranged in parallel with an N-number of identical carrier amplifiers in such a manner that each pair of the carrier amplifier and the peaking amplifier collectively operates as a Doherty amplifier, and an N-number of impedance control circuits are respectively connected to each of the output ends of the said N-number of carrier amplifiers, the said N being a positive integer; and
wherein the output matching circuit is matched to $R_{opt}/2N$, and a characteristic impedance of each of the N-number of impedance control circuits is equal to $R_{opt}$, the said $R_{opt}$ being an optimal source impedance of each of the impedance control circuits.

7. The power amplifier of claim 1, further comprising a plurality of secondary harmonic short circuits, at least one of which is respectively connected to the output ends of the carrier amplifier and the peaking amplifier.

8. The power amplifier of claim 1, wherein the at least one carrier amplifier, the at least one peaking amplifier, the plurality of input matching circuits, and the at least one impedance control circuit are embedded in the MMIC chip.

9. The power amplifier of claim 8, wherein a first portion of the at least one output matching circuit is embedded in the MMIC chip and a second portion is provided by the bonding inductor.

10. The power amplifier of claim 1, wherein the at least one carrier amplifier, the at least one peaking amplifier, the plurality of input matching circuits, and the at least one impedance control circuit are integrated in the monolithic microwave integrated circuit (MMIC) chip.

11. The power amplifier of claim 10, wherein a first portion of the at least one output matching circuit is integrated in the MMIC chip and a second portion is provided by the bonding inductor.

12. A power amplifier, comprising:
at least one carrier amplifier;
at least one peaking amplifier arranged in parallel with the carrier amplifier in such a manner that the carrier amplifier and the peaking amplifier collectively operate as a Doherty amplifier;
a plurality of input matching circuits, at least one of which is respectively connected to the input ends of the carrier amplifier and the peaking amplifier;
a plurality of secondary harmonic short circuits, at least one of which is respectively connected to the output ends of the carrier amplifier and the peaking amplifier;
at least one impedance control circuit, each of which is connected to an output end of each carrier amplifier for controlling a load line impedance of said each carrier amplifier;
at least one output matching circuit directly or indirectly connected to output ends of the impedance control circuit and the peaking amplifier; and
at least one first delay circuit, each of which is connected to an input end of one of the input matching circuits connected to the input end of the peaking amplifier for matching delays between the carrier amplifier and the peaking amplifier;
wherein each of the impedance control circuit and the first delay circuit is a λ/4 transformer, the λ/4 transformer of the impedance control circuit being a π-network including at least one inductor and at least one capacitor, the inductor being a microstrip line.

13. The power amplifier of claim 12, wherein the at least one carrier amplifier, the at least one peaking amplifier, the plurality of input matching circuits, and the at least one impedance control circuit are integrated in a monolithic microwave integrated circuit (MMIC) chip.

14. The power amplifier of claim 13, wherein a first portion of the at least one output matching circuit is embedded in the MMIC chip and a second portion is provided by a passive device connected to the MMIC chip.

15. The power amplifier of claim 13, wherein a first portion of each secondary harmonic short circuit is embedded in the MMIC chip and a second portion is provided by a passive device connected to the MMIC chip.

16. A power amplifier, comprising:

at least one carrier amplifier;

at least one peaking amplifier arranged in parallel with the carrier amplifier in such a manner that the carrier amplifier and the peaking amplifier collectively operate as a Doherty amplifier;

a plurality of input matching circuits, at least one of which is respectively connected to the input ends of the carrier amplifier and the peaking amplifier;

at least one impedance control circuit, each of which is connected to an output end of each carrier amplifier for controlling a load line impedance of said each carrier amplifier;

at least one output matching circuit directly or indirectly connected to output ends of the impedance control circuit and the peaking amplifier; and at least one first delay circuit, each of which is connected to an input end of one of the input matching circuits connected to the input end of the peaking amplifier for matching delays between the carrier amplifier and the peaking amplifier;

wherein an N-number of identical peaking amplifiers are arranged in parallel with an N-number of identical carrier amplifiers in such a manner that each pair of the carrier amplifier and the peaking amplifier collectively operates as a Doherty amplifier, and an N-number of impedance control circuits are respectively connected to each of the output ends of the said N-number of carrier amplifiers, the said N being a positive integer greater than one; and wherein an input end of the at least one output matching circuit is directly or indirectly connected to output ends of the N-number of impedance control circuits and the N-number of peaking amplifiers, the output matching circuit is matched to $R_{opt}/2N$, and a characteristic impedance of each of the N-number of impedance control circuits is equal to $R_{opt}$, the said $R_{opt}$ being an optimal source impedance of each of the impedance control circuits.

* * * * *